United States Patent
Rogachev

(10) Patent No.: US 10,873,327 B2
(45) Date of Patent: *Dec. 22, 2020

(54) HOT SWAP CONTROLLER WITH MULTIPLE CURRENT LIMITS

(71) Applicant: Texas Instruments Incorporated, Dallas, TX (US)

(72) Inventor: Artem Andreevich Rogachev, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/738,922

(22) Filed: Jan. 9, 2020

(65) Prior Publication Data

US 2020/0144999 A1 May 7, 2020

Related U.S. Application Data

(63) Continuation of application No. 16/407,462, filed on May 9, 2019, now Pat. No. 10,566,965, which is a continuation of application No. 15/719,665, filed on Sep. 29, 2017, now Pat. No. 10,326,436.

(51) Int. Cl.
| | |
|---|---|
| *H03K 17/0812* | (2006.01) |
| *H03K 17/12* | (2006.01) |
| *H03K 5/19* | (2006.01) |
| *G06F 13/40* | (2006.01) |
| *H02H 9/00* | (2006.01) |

(52) U.S. Cl.
CPC ... *H03K 17/08122* (2013.01); *G06F 13/4081* (2013.01); *H02H 9/004* (2013.01); *H03K 5/19* (2013.01); *H03K 17/122* (2013.01)

(58) Field of Classification Search
CPC ............... H03K 5/19; H03K 17/0812; H03K 17/08122; H03K 17/12; H03K 17/122
USPC ............................. 326/82, 83; 327/108, 109
See application file for complete search history.

(56) References Cited

U.S. PATENT DOCUMENTS

| | | | | |
|---|---|---|---|---|
| 4,633,162 A | * | 12/1986 | Melbert | G05F 1/468 323/275 |
| 4,731,574 A | * | 3/1988 | Melbert | G05F 1/573 323/275 |
| 4,987,348 A | * | 1/1991 | Wong | H05B 39/02 315/307 |

(Continued)

*Primary Examiner* — William Hernandez
(74) *Attorney, Agent, or Firm* — Lawrence J. Bassuk; Charles A. Brill; Frank D. Cimino

(57) ABSTRACT

A hot swap controller circuit includes a comparator and current control circuitry. The comparator is configured to compare voltage across a power transistor controlled by the hot swap controller circuit to a predetermined threshold voltage. The current control circuitry is coupled to the comparator. The current control circuitry is configured to limit current through the power transistor to no higher than a predetermined high current based on the voltage across the transistor being less than the predetermined threshold voltage. The current control circuitry is also configured to limit the current through the transistor to be no higher than a predetermined low current based on the voltage across the transistor being greater than the predetermined threshold voltage. The predetermined high current is greater than the predetermined low current.

17 Claims, 3 Drawing Sheets

(56) References Cited

U.S. PATENT DOCUMENTS

| | | | | |
|---|---|---|---|---|
| 5,929,617 | A * | 7/1999 | Brokaw | G05F 1/575 |
| | | | | 323/280 |
| 6,400,203 | B1 * | 6/2002 | Bezzi | H03K 5/08 |
| | | | | 327/309 |
| 7,002,326 | B1 * | 2/2006 | Smith | G05F 1/575 |
| | | | | 323/282 |
| 8,963,617 | B1 * | 2/2015 | Sim | H03K 3/012 |
| | | | | 327/427 |
| 10,425,077 | B1 * | 9/2019 | Spalding, Jr. | H03K 17/302 |
| 2003/0095368 | A1 * | 5/2003 | Daniels | H03K 17/0822 |
| | | | | 361/93.9 |
| 2006/0220684 | A1 * | 10/2006 | Khoo | H03K 19/00315 |
| | | | | 326/83 |
| 2011/0043178 | A1 * | 2/2011 | Cheng | G05F 1/56 |
| | | | | 323/283 |
| 2012/0086480 | A1 * | 4/2012 | Lin | H02M 1/12 |
| | | | | 327/133 |
| 2013/0166947 | A1 * | 6/2013 | Yang | H02M 3/156 |
| | | | | 714/14 |
| 2019/0036521 | A1 * | 1/2019 | Wu | H03K 17/0822 |

* cited by examiner

US 10,873,327 B2

HOT SWAP CONTROLLER WITH MULTIPLE CURRENT LIMITS

CROSS REFERENCE TO RELATED APPLICATIONS

Under 35 U.S.C. § 120, this continuation application claims benefits of priority to U.S. patent application Ser. No. 16/407,462, filed on May 9, 2019, now U.S. Pat. No. 10,566,965, issued Feb. 18, 2020, which claims benefits of priority to U.S. patent application Ser. No. 15/719,665, filed on Sep. 29, 2017, now U.S. Pat. No. 10,326,436, issued Jun. 18, 2019. The entirety of the above referenced applications are hereby incorporated herein by reference.

BACKGROUND

In electronic systems, it is often desirable to be able to replace a printed circuit board or other subsystem without disabling power to the system. This process is typically referred to as "hot swapping." Hot swap systems can be implemented to allow addition or replacement of components in a variety of applications. For example, in computer systems, hot swapping will allow the replacement of a board or the addition of a new board in the system without loss of information in volatile memory in the system, without requiring rebooting the system, etc. In systems such as communication systems and the like, where a plurality of boards of similar function are plugged into a motherboard, boards may be hot swapped or additional boards added without shutting down the system. This allows maintenance and upgrading without interfering with communications or other functions in channels serviced by the remaining boards in the system.

A hot swap controller is a circuit that enables an electronic device to be safely inserted into (and removed from) a connector of a host system (e.g. a computer, a server, a communication device, a storage unit, etc.) while the host system is operational. Hot swap controllers are generally designed to limit inrush current to the electronic device that could damage or cause a malfunction in the electronic device or the host system, thereby enabling safe insertion of the electronic device into the host system or removal of the electronic device from the host system, without interrupting operations of the host system.

SUMMARY

A hot swap controller that improves utilization of the safe operating area of a power transistor is disclosed herein. In one embodiment, an electronic device includes a transistor and a hot swap controller. The transistor is configured to switch power to the electronic device. The hot swap controller is configured to control operation of the transistor. The hot swap controller includes a comparator and current control circuitry. The comparator is configured to compare voltage across the transistor to a predetermined threshold voltage. The current control circuitry is coupled to the comparator. The current control circuitry is configured to limit current through the transistor to no higher than a first predetermined current based on the voltage across the transistor being less than the predetermined threshold voltage. The current control circuitry is also configured to limit the current through the transistor to be no higher than a second predetermined current based on the voltage across the transistor being greater than the predetermined threshold voltage. The first predetermined current is greater than the second predetermined current.

In another embodiment, a hot swap controller circuit includes a comparator and current control circuitry. The comparator is configured to compare voltage across a power transistor controlled by the hot swap controller circuit to a predetermined threshold voltage. The current control circuitry is coupled to the comparator. The current control circuitry is configured to limit current through the power transistor to no higher than a predetermined high current based on the voltage across the transistor being less than the predetermined threshold voltage. The current control circuitry is also configured to limit the current through the transistor to be no higher than a predetermined low current based on the voltage across the transistor being greater than the predetermined threshold voltage. The predetermined high current is greater than the predetermined low current.

In a further embodiment, a method for hot swapping includes comparing voltage across a power transistor to a predetermined threshold voltage. Current through the power transistor is limited to be no higher than a first predetermined current based on the voltage across the power transistor being less than the predetermined threshold voltage. The current through the power transistor is limited to be no higher than a second predetermined current based on the voltage across the power transistor being greater than the predetermined threshold voltage. The first predetermined current is greater than the second predetermined current.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In hot swap systems that employ a power metal oxide semiconductor field effect transistor (MOSFET), the hot swap controller that drives the MOSFET must ensure that the MOSFET operates within the safe operating area at all times. Many conventional hot swap controllers implement a constant power foldback scheme that limits total MOSFET power dissipation to a constant predetermined value. However, MOSFETs do not have a constant power safe operating area. For example, a MOSFET may operate safely with power of 260 watts for 10 milliseconds with a drain-to-source voltage ($V_{ds}$) of 70 volts (V), and operate safely with power of 800 watts for 10 milliseconds with a $V_{ds}$ of 20 V. Accordingly, constant power foldback significantly underutilizes the safe operating area of the power MOSFET.

Embodiments of the hot swap controller disclosed herein implement a current control technique that more efficiently utilizes the safe operating area of the MOSFET by providing two levels of current limiting. Embodiments apply a high current limit while $V_{ds}$ is below a predetermined threshold, and apply a lower current limit while $V_{ds}$ is above the predetermined threshold. Embodiments also simplify hot swap controller circuitry by eliminating the need for a Gilbert multiplier.

Figure 1:
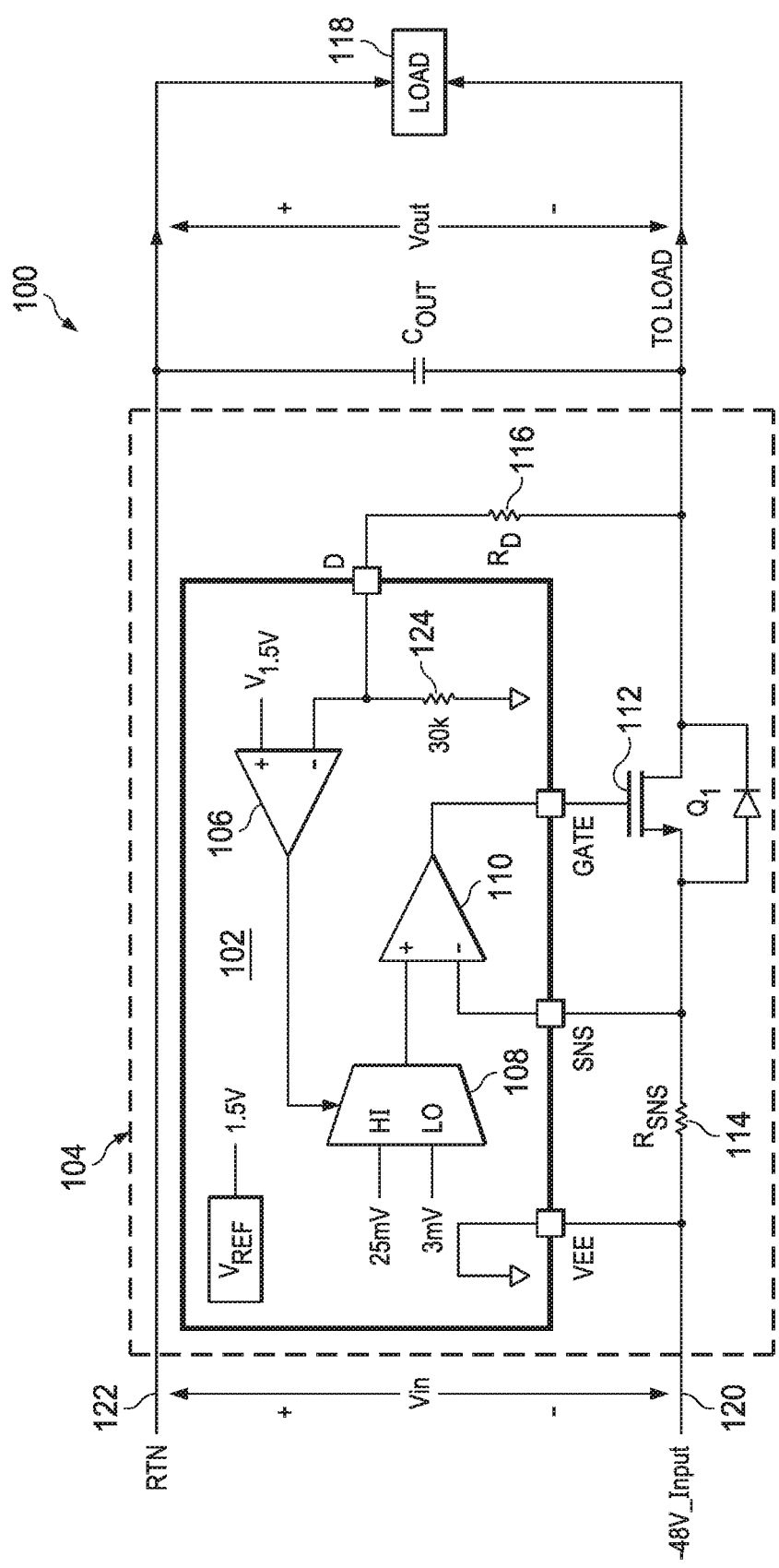
FIG. 1 shows a schematic diagram of an electronic device that includes a hot-swap controller that implements dual current limits in accordance with various embodiments.

FIG. 1 shows a schematic diagram of an electronic device 100 that includes a hot-swap controller that implements dual current limits in accordance with various embodiments. The electronic device 100 includes a hot swap control circuit 102, a power transistor 112, a sense resistor 114, a control resistor 116, and a load circuit 118. Hot swap control circuit includes a VEE terminal connected to power input 122, a SNS terminal connected to between sense resistor 114 and power transistor 112, a gate terminal connected to a gate of power transistor 112, and a D terminal connected to one end of control resistor 116. The hot swap control circuit 102 (also referred to herein as a "hot swap controller"), the power transistor 112, the sense resistor 114, and the control resistor 116 form a hot swapping circuit 104 that switches power to the load circuit 118. A power source, such as a battery or power supply is coupled to the power inputs 120 and 122 to power the hot swap control circuit 102 and the load circuit 118. The load circuit 118 may be any electronic circuit that can be powered via the hot swapping circuit 104.

Figure 2:
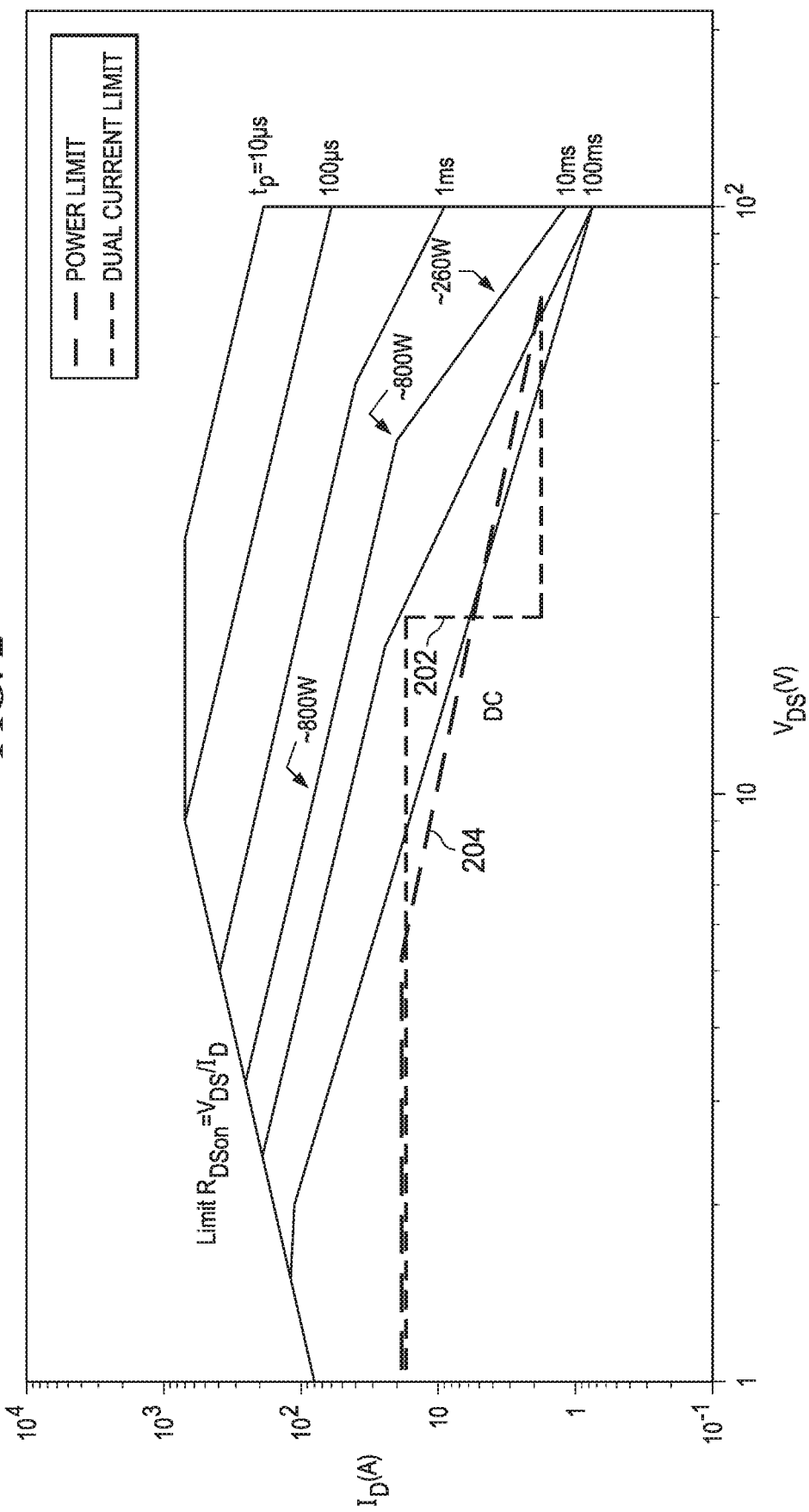
FIG. 2 shows a graph of performance of a hot-swap controller that implements dual current limits in accordance with various embodiments.

The hot swap control circuit 102 drives the power transistor 112 to switch power to the load 118. In some embodiments, the power transistor 112 is a power MOSFET (e.g., an n-channel power MOSFET). To protect the power transistor 112 from damage due to overcurrent or excessive power dissipation, the hot swap control circuit 102 ensures that the power transistor 112 operates within its safe operating area. The safe operating area is generally a function of voltage across the transistor 112, current flowing through the transistor 112, and time. FIG. 2 shows a graph of the safe operating area of the power transistor 112. Some embodiments of the power transistor 112 may provide a different safe operating area, and FIG. 2 illustrates an example of the safe operating area of one embodiment of the power transistor 112.

FIG. 2 shows that the power transistor 112 can operate safely for at least 10 milliseconds at about 800 Watts with a drain-to-source voltage of 10 volts or 40 volts, but at only about 260 Watts with a drain-to-source voltage of 72 volts. To apply the safe operating area of the power transistor 112 efficiently, the hot swap control circuit 102 implements multiple (e.g., dual) current limits. The hot swap control circuit 102 limits the current that can flow through the power transistor 112 based on the voltage across the power transistor 112. If the voltage across the power transistor 112 (e.g., drain-source voltage) exceeds a threshold value, then the hot swap control circuit 102 limits the current that may flow through the power transistor 112 to a lower value (i.e., a lower current limit). If the voltage across the power transistor 112 is less than the threshold value, then the hot swap control circuit 102 limits the current that may flow through the power transistor 112 to a higher value (i.e., a higher current limit). In FIG. 2, the threshold is set to about 20 volts. If the voltage across the power transistor is less than 20 volts, then the hot swap control circuit 102 limits the current through the power transistor 112 to no more than about 20 amperes. If the voltage across the power transistor is greater than 20 volts, then the hot swap control circuit 102 limits the current through the power transistor 112 to no more than about 2 amperes. The threshold and current limit values may vary with different implementations of the hot swapping circuit 104.

The hot swap control circuit 102 includes a threshold comparator 106, a selector 108, and a current control amplifier 110. The hot swap control circuit 102 may include additional components that have been omitted from FIG. 1 in the interest of clarity. For example, the hot swap control circuit 102 may include reference voltage generation circuitry to generate the various fixed voltages described herein, timing circuitry to time voltage transients, and various other components. The threshold comparator 106 compares a reference voltage (e.g., 1.5 volts) to the drain voltage of the power transistor 112, as divided by a voltage divider formed by the resistor 124 and the control resistor 116. The threshold setting the voltage at which the hot swap control circuit 102 switches between the lower and higher current limits can be set by selecting the value of the control resistor 116. For example, given a 30 kilo-ohm value for resistor 124 and a 1.5 volt reference voltage, the threshold value of the hot swapping circuit 104 may be computed as:

$$V_{Thres} = \frac{1.5 \text{ V} \times (30 \text{ k}\Omega + R_D)}{30 \text{ k}\Omega} \quad (1)$$

where $R_D$ is the resistance of the control resistor 116. Thus, if the control resistor 116 has a value of 270 kilo-ohms, then the threshold voltage will be 15 volts using equation (1).

The output of the comparator 106 selects application of the higher or lower current limits. Input voltages of the selector 108, in conjunction with the resistance of the sense resistor 114, set the higher and lower current limits. For example, in the hot swap control circuit 102, the selector 108 routes 3 millivolts to the current control amplifier 110 if the lower current limit is selected and routes 25 millivolts to the current control amplifier 110 if the lower current limit is selected.

The selector 108 and the current control amplifier 110 are part of current control circuitry that controls the maximum current flowing through the power transistor 112. The current control amplifier 110 compares the voltage across the sense resistor 114 to the voltage provided by the selector 108 to determine whether the current through the power transistor 112 exceeds the applied current limit. If the voltage across the sense resistor 114 (which represents the current flowing through the sense resistor 114) exceeds the voltage output of the selector 108, then the current control amplifier 110 reduces the voltage applied to the gate terminal of the power transistor 112 to regulate the current flowing through the power transistor 112, and ensure that the current does not exceed the applied current limit.

In the hot swapping circuit 104, the values of the higher and lower current limits can be set by selection of the value of the sense resistor 114. In the embodiment of the hot swap control circuit 102 shown in FIG. 1, wherein 3 millivolts is applied to the input of the selector 108 and routed to the current control amplifier 110 based on the voltage across the power transistor 112 exceeding the threshold set by the comparator 106, the lower current limit is:

$$I_{CLL} = \frac{3 \text{ mv}}{R_{SNS}} \quad (2)$$

where $R_{SNS}$ is the resistance of the sense resistor 114. Thus, if the sense resistor 114 has a value of 1 milliohm, then the lower current limit will be 3 amperes using equation (2).

Similarly, given the 25 millivolts applied to the input of the selector 108 in the embodiment of FIG. 1, and routed to the current control amplifier 110 based on the voltage across the power transistor 112 not exceeding the threshold set by the comparator 106, the higher current limit is:

$$I_{CHL} = \frac{25 \text{ mv}}{R_{SNS}}. \quad (3)$$

Thus, if the sense resistor 114 has a value of 1 milliohm, then the higher current limit will be 25 amperes using equation (3).

Returning to FIG. 2, current limitation by a conventional constant power scheme is shown as curve 204. Because the power transistor 112 does not provide a constant power safe operating area, current limitation by a conventional constant power scheme underutilizes the safe operating area of the power transistor 112. In contrast, the dual current limit technique of the hot swapping circuit 104, shown as curve 202, maximizes the ability of the power transistor 112 to ride through steps or transients in voltage across the power transistor 112, and protects the power transistor 112 when there is a large drop in voltage across the power transistor 112 (e.g., providing power into a short).

Figure 3:
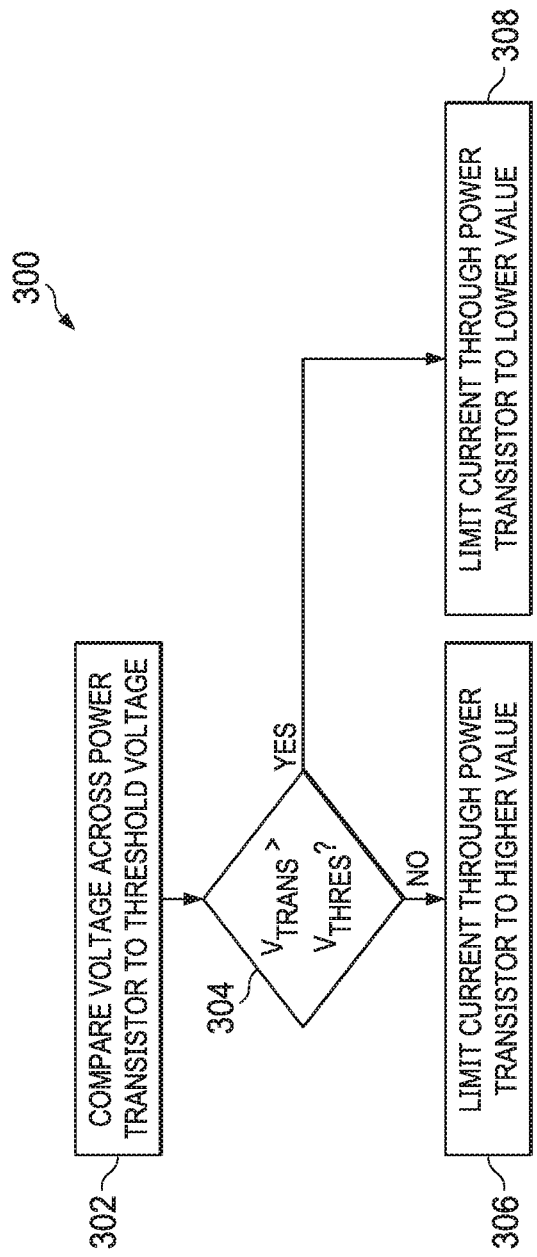
FIG. 3 shows a flow diagram for a method for controlling current using a hot-swap controller that implements dual current limits in accordance with various embodiments.

FIG. 3 shows a flow diagram for a method 300 for controlling current in a hot-swap controller that implements dual current limits in accordance with various embodiments. Though depicted sequentially as a matter of convenience, at least some of the actions shown can be performed in a different order and/or performed in parallel. Additionally, some embodiments may perform only some of the actions shown.

In block 302, the hot swap control circuit 102 is monitoring the voltage across the power transistor 112. The hot swap control circuit 102 monitors the voltage across the power transistor 112 by comparing the voltage across power transistor 112 to a threshold voltage. Comparison of the voltage across the power transistor 112 to a threshold voltage may be implemented by dividing the voltage across the power transistor 112 by a constant and comparing the divided voltage across the power transistor 112 to a reference voltage.

In block 304, if the voltage across the power transistor 112 does not exceed the threshold voltage, then in block 306, the hot swap control circuit 102 limits the current through the power transistor 112 a first current value. In some embodiments, the first current value may be set as a ratio of a first reference voltage generated in the hot swap control circuit 102 to the resistance of the sense resistor 114.

If, in block 304, the voltage across the power transistor 112 does exceed the threshold voltage, then in block 308, the hot swap control circuit 102 limits the current through the power transistor 112 a second current value. In some embodiments, the second current value may be set as a ratio of a second reference voltage generated in the hot swap control circuit 102 to the resistance of the sense resistor 114. The second reference voltage is lower than the first reference voltage, and the second current value is lower than the first current value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Controller circuitry comprising:
   (a) a power terminal adapted to be coupled to a power supply lead, a sense terminal adapted to be coupled to a first terminal of a power transistor, a gate terminal adapted to be coupled to a gate of the power transistor, and a control terminal adapted to be coupled to a second terminal of the power transistor through a control resistor;
   (b) a voltage divider resistor coupled between the control terminal and the power terminal;
   (c) comparator circuitry having a first input coupled to the control terminal, having a second input coupled to a reference voltage output, and having a comparator output;
   (d) selector circuitry having a high voltage input, having a low voltage input, having a control input coupled to the comparator output, and a selector output; and
   (e) an amplifier having a first input coupled to the selector output, having a second input coupled to the sense terminal, and having an amplifier output coupled to the gate terminal.

2. The controller circuitry of claim 1 in which the comparator first input is an inverting input.

3. The controller circuitry of claim 1 in which the comparator second input is a non-inverting input.

4. The controller circuitry of claim 1 in which the reference voltage output provides 1.5 volts.

5. The controller circuitry of claim 1 in which the high voltage input receives 25 millivolts.

6. The controller circuitry of claim 1 in which the low voltage input receives 3 millivolts.

7. The controller circuitry of claim 1 in which the amplifier first input is a non-inverting input.

8. The controller circuitry of claim 1 in which the amplifier second input is an inverting input.

9. An electronic device comprising:
   (a) a power input;
   (b) a power output;
   (c) a power transistor having a gate and having power terminals coupled between the power input and the power output;
   (d) a sense resistor coupled between the power input and the power transistor;
   (e) a control resistor having a lead coupled to the power output; and
   (f) controller circuitry including:
      (i) a power terminal to the power input, a sense terminal coupled to a first terminal of the power transistor, a gate terminal coupled to the gate of the power transistor, and a control terminal coupled to the second terminal of the power transistor through the control resistor;
      (ii) a voltage divider resistor coupled between the control terminal and the power terminal;

(iii) comparator circuitry having a first input coupled to the control terminal, having a second input coupled to a reference voltage output, and having a comparator output;

(iv) selector circuitry having a high voltage input, having a low voltage input, having a control input coupled to the comparator output, and having a selector output; and (v) an amplifier having a first input coupled to the selector output, having a second input coupled to the sense terminal, and having an amplifier output coupled to the gate terminal.

10. The electronic device of claim 9 in which the comparator first input is an inverting input.

11. The electronic device of claim 9 in which the comparator second input is a non-inverting input.

12. The electronic device of claim 9 in which the reference voltage output provides 1.5 volts.

13. The electronic device of claim 9 in which the high voltage input receives 25 millivolts.

14. The electronic device of claim 9 in which the low voltage input receives 3 millivolts.

15. The electronic device of claim 9 in which the amplifier first input is a non-inverting input.

16. The electronic device of claim 9 in which the amplifier second input is an inverting input.

17. The electronic device of claim 9 in which the power input receives minus 48 volts.

* * * * *